United States Patent [19]

La Fiandra

[11] 4,453,106
[45] Jun. 5, 1984

[54] COMPRESSION BASE LAMP

[75] Inventor: Carlo La Fiandra, New Canaan, Conn.

[73] Assignee: The Perkin-Elmer Corporation, Norwalk, Conn.

[21] Appl. No.: 171,681

[22] Filed: Jul. 24, 1980

[51] Int. Cl.³ .............................................. H01J 5/50
[52] U.S. Cl. ..................... 313/331; 29/505; 29/507; 65/154; 174/50.61; 313/315; 313/333
[58] Field of Search ............ 313/315, 331, 332, 333, 313/334; 174/DIG. 8, 50.61; 65/153, 154, 155; 29/505, 507

[56] References Cited

U.S. PATENT DOCUMENTS

| | | | |
|---|---|---|---|
| 1,727,755 | 9/1929 | Dickinson | 29/447 |
| 2,271,658 | 2/1942 | Miller | 65/154 X |
| 3,448,320 | 6/1969 | Millikan | 313/315 |
| 3,505,556 | 4/1970 | Belknap | 313/315 X |
| 3,646,387 | 2/1972 | Ayres | 313/274 |
| 4,017,959 | 4/1977 | Fletcher et al. | 29/447 |
| 4,119,832 | 10/1978 | Audesse et al. | 313/315 |
| 4,151,364 | 4/1979 | Ellis | 174/DIG. 8 |
| 4,174,563 | 11/1979 | Simpson | 174/DIG. 8 |
| 4,233,731 | 11/1980 | Clabburn et al. | 174/DIG. 8 |

*Primary Examiner*—Saxfield Chatmon, Jr.
*Attorney, Agent, or Firm*—S. A. Giarratana; E. T. Grimes; T. P. Murphy

[57] ABSTRACT

A lamp comprising a tubular quartz envelope having a mounting base compression fitted to one end thereof.

13 Claims, 12 Drawing Figures

COMPRESSION BASE LAMP

BACKGROUND OF THE INVENTION

Gaseous discharge lamps generally comprise a transparent or translucent quartz envelope containing a gas or vapor in an otherwise evacuated enclosure which upon energization glows to provide an intense light. The vapor may be a metallic vapor such as that produced by a small amount of mercury in the evacuated enclosure. Thus, upon energization the mercury forms a vapor which is ionized to create an intense glow. One method of energization of the lamp is provided by using electrodes which extend into the enclosure. A potential connected across the ends of the electrodes external to the envelope effects the glow.

Lamps of the type described find particular use in mask projection systems of the type disclosed in U.S. Pat. No. 4,011,011, having the same Assignee as the present invention. This patent describes a mask projection system wherein photoresist coated wafers are exposed to the light projection of a mask containing intricate circuit details in the production of integrated circuits. A lamp used in such an environment must be precisely positioned in the optical projection system. Thus, assuming an accurately positioned mounting arrangement the lamp itself must be dimensionally accurate in its configuration.

A critical consideration in lamps of this nature is the security of the connection between base and envelope. Cost efficiency gained by simplification of fabrication procedures is also another important factor of the present invention. A lamp manufactured for use in the mask projection system described in the above mentioned patent is disclosed and claimed in U.S. Pat. No. Re. 30,315 having the same Assignee as the present invention. This patent describes a lamp having a glass envelope defining in a cavity of capillary cross section and arcuate configuration. One end of the envelope has an electrically conductive mounting base fixed thereto whose configuration and relationship to the rest of the envelope is such that upon installation of the base and a mounting fixture, the lamp is accurately positioned in its operating environment.

In the manufacture of the lamp, the metal base has an axial bore sufficiently large to receive an end stub of the envelope. The base and envelope are positioned in all 6 degrees of freedom axially, radially, and angularly relative to each other with the aid of a jig. An epoxy is then inserted in the annular space defined by the outside diameter of the lamp and the inside bore diameter of the base. The epoxy is allowed to harden and may be aided in the hardening process by heating. This type of mounting requires that the glass envelope be bent to its arcuate configuration prior to basing which significantly increases the steps to produce a completed lamp.

In addition, aside from the time consuming steps required to position and fix the metal base on the glass envelope, the use of epoxy results in a 2 to 3% rejection rate of the lamps due to loose bases.

Also, a defective batch of epoxy can result in a reworking of an entire day's production run.

The present invention is an improvement of the above described invention of U.S. Pat. No. Re. 30,315 by utilizing a compression fit of the base to the lamp which eliminates the use of the epoxy sealing technique with all its attendant disadvantages. In addition, the present invention provides an extremely secure fit between base and envelope which is obtainable in a highly cost efficient manner.

SUMMARY OF THE INVENTION

The present invention contemplates a lamp comprising a tubular quartz envelope wherein a metal mounting base is secured to one end of the quartz envelope by means of an interference or compression fit. The metal base includes a tubular extension having an inside diameter less than the outside diameter of the end of the quartz envelope to which it is to be secured. The metal base is heated to a predetermined temperature and the end of the quartz envelope is inserted into the heated tubular extension of the base which is then allowed to cool. Since the metal used is chosen to have a higher thermal expansivity than the quartz material used, the diameters of the tubular extension and the end of the quartz envelope are such as to permit the end of the quartz envelope to be inserted into the tubular extension of the base. The construction is then allowed to cool with the tubular extension of the base shrinking significantly more than the end of the quartz envelope such that a strong interference or compression fit between the two is obtained along with yielding in the base material.

The construction of the present invention may take various forms all of which provide acceptable envelope-base connections. For example, the quartz envelope may comprise a single length of precision diameter tubing such that the end to which the base is fixed to always of the exactly correct diameter. Also, two pieces of quartz tubing may be joined by fusing wherein only the end to which the base is to be attached is of the requisite precise diameter. Third, tubing may be non-precision stock tubing wherein the end to which the base is to be attached is precision ground to the correct diameter. Four, stock tubing may be used which is fitted to bases from stock, that is, bases of various inside diameters which are used on a selected basis.

The base itself which comprises a tubular extension and a main substantially thicker portion may be fitted to the end of the quartz envelope at either end of the base. For example, the end of a quartz envelope may be inserted in the tubular extension initially or it may be inserted into the tubular extension through the large portion of the base. In either case, it is the tubular extension which effects the compression fit.

Furthermore, the base may be machined to its desired shape, for example, hexagonal before actually being fixed to the quartz envelope or it may be first fixed to the quartz envelope and then machined to its desired configuration, referencing the lamp seating surfaces to the pin for accurate alignment.

DESCRIPTION

Figure 1:
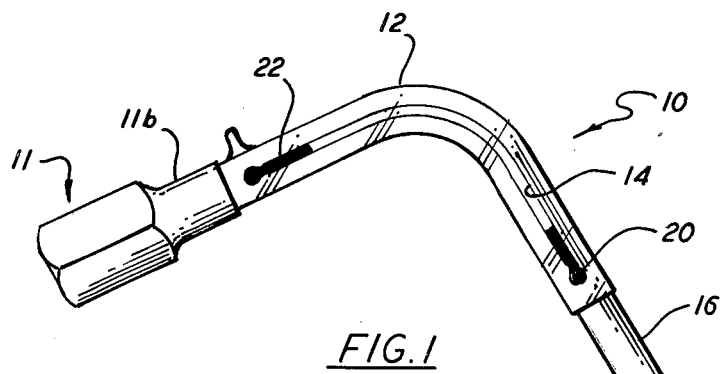
FIG. 1 illustrates a lamp made in accordance with the present invention.

FIG. 1 illustrates a lamp similar to that disclosed in U.S. Pat. No. 3,878,419 except for the mounting base configuration and the manner in which the mounting base is secured to the quartz envelope. It should be noted at the outset that while Applicant's structure for securing his mounting base to a quartz envelope finds particular use in lamps similar to that depicted in FIG. 1, it is not confined to lamps of any particular configuration and is useful in any lamp structure where a metal mounting base is to be secured to a quartz envelope.

FIG. 1 illustrates a mercury vapor lamp of a particular arcuate configuration which adapts it for use as the light source in an apparatus such as described in the aforementioned U.S. Pat. No. 4,011,011 for resist exposure in the production of semiconductor devices. Lamp 10 comprises a tubular envelope 12 of quartz or other radiation transmitting material which is highly resistant to the high temperatures at which the lamp operates. The interior of envelope 12 includes a cavity 14 of capillary dimensions. One end of the envelope 10 terminates in a metal mounting base 11. The metal mounting base 11 may be made of brass (plated or unplated) or similar metal and is secured to the end of envelope 10 by means of a compression fit to be described hereinafter. The other end of envelope 10 terminates in a stub 16. Each end of the envelope 10 is provided with an electrode 20 and 22 which provide electrical connections for energizing the metal vapor in cavity 14. Electrode 20 is electrically connected by a conductor, not shown, to a flexible connection lead 24 mechanically secured to stub 16 at one end and carrying a connection fitting such as a banana plug 26 at its free end. The flexibility and conductivity required in lead 24 is achieved in the illustrated embodiment by fabricating it of tubular silver braid. Electrical connection to electrode 22 is made through the base 11 in a manner to be described hereinbelow. The cavity 14 contains a quantity of metal such as mercury. The operation of lamp 10 is conventional and when energized by application of a suitable high voltage on electrodes 20 and 22, mercury vapor conducts current between the electrodes 20 and 22 forming a luminous plasma of high intensity.

Figure 2:
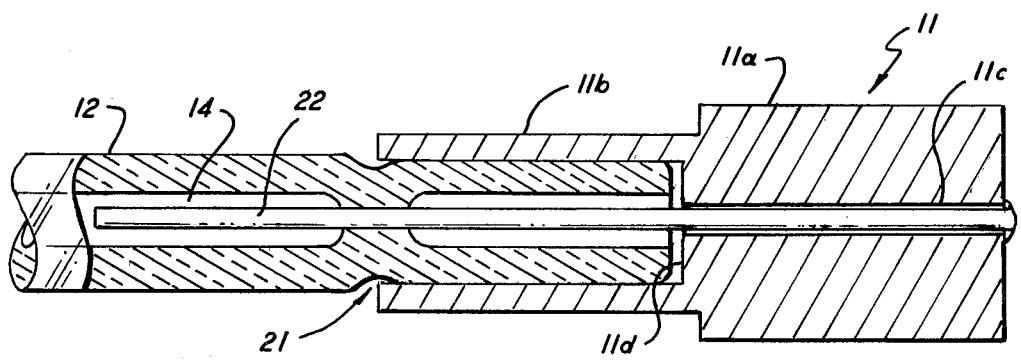
FIG. 2 illustrates partly in cross section the juncture of envelope and base in accordance with the present invention.

FIG. 2 shows the base 11 secured to envelope 12.

The base 11 comprises two portions, 11a and 11b. Base portion 11a comprises a substantially solid piece of metal having an axial bore 11c therethrough. Base portion 11b is a tubular extension of base portion 11. The wall thickness of tubular extension 11b is thin, for example, of the order of 0.006 of an inch.

Base portion 11a may be of any desired configuration necessary to accurately position the lamp in its operating environment. In one particular use, as above mentioned, the shape of base portion of 11a is hexagonal.

The inside diameter of tubular extension 11b should be approximately 0.003 of an inch less than the outside diameter of the glass envelope 12 to which it is to be secured. The metallic material from which the base 11 is made should have an appropriate high coefficient of thermal expansion as well as an acceptable Young's modulus. Some of the metals which fulfil these requirements are tungsten, 303 stainless steel, leadlow, 440 stainless steel, aluminum, and brass. A practical embodiment of the present invention uses a base made from brass since brass has a very good coefficient of thermal expansion as well as an ideal Young's modulus which for brass is $12.8 \times 10^6$.

FIG. 2 shows the end of glass envelope 12 in position within tubular extension 11b where it is held in a compression or shrink fit.

In order to accomplish this compression fit, the tubular extension 11b is heated to a sufficiently high temperature so that it expands in inside diameter sufficiently to accommodate the end of envelope 12. Upon cooling, the tubular extension 11b contracts or shrinks thereby holding the end of envelope 12 securely in what is known as a compression, interference, or shrink fit.

In the practical embodiment where brass forms the material base 11 the tubular extension of 11b is uniformly heated to approximately 1000° fahrenheit. This efficiently expands the inside diameter of extension 11b so that it accommodates the end of envelope 12. The end of envelope 12 is not heated for the reason that it is made from quartz which for all practical purposes is immune to damage by heat. In other words, it is unaffected over extremely wide ranges of temperature. This is one of the reasons that makes the present invention possible. Another reason that makes the present invention possible is the actual deformation of the metal during shrinkage over the envelope 12, that is, it remains in tact and doesn't split during shrinking or over the wide temperature range of use of a typical gaseous discharge lamp. As the tubular extension 11b shrinks during cooling, the brass content thereof, extrudes or cold forms to provide an extremely secure binding between the end of quartz envelope 12 and the base 11.

In the embodiment shown in FIG. 2, the glass envelope 12 is made from high precision diameter quartz as will be described more fully with respect to FIG. 5. Thus, the end of envelope 12 has a highly accurate outside diameter which makes it highly compatable with the inside diameter of the tubular extension 11b. The electrode 22 is secured within cavity 14 of envelope 12 by a ring seal 21. The ring seal 21 is formed by pinching the glass envelope while it is in a deformable state by being raised to a sufficiently high flow temperature. The location of ring seal 21, i.e., just beyond the end of tubular extension 11b has been found to eliminate stresses in the envelope 12 during the shrink fit process in addition to its main purpose of securing the electrode 22 in place.

The electrode 22 passes through the bore 11c of the base 11. External electrical contact to the electrode 22 may be made through screws inserted through diametrically located holes in the base as best seen in FIG. 3. The end of envelope 12 within tubular extension 11b terminates short of base face 11d providing a space between the end of envelope 12 and base face 11d to allow for a possible expansion of the envelope within tubular extension 11b. In addition, the end of tubular envelope 12 may be chamfered to provide a good lead in to the tubular extension 11b.

As mentioned above, the inside diameter of tubular extension 11b should be smaller than the outside diameter of the end of the quartz envelope. The dimensions of the base 11 are easily obtained to precise tolerances, e.g. by machining. In a practical embodiment, the inside diameter of unheated tubular extension 11b should ideally be $0.003 \pm 0.001$ less than the outside diameter of the end of the quartz envelope 12 to which the base is to be attached.

The dimensions of stock quartz tubing do not consistantly fall within acceptable tolerances for purposes of this invention.

FIGS. 5, 6, 7 and 8 show various ways of overcoming this problem.

Figure 5:
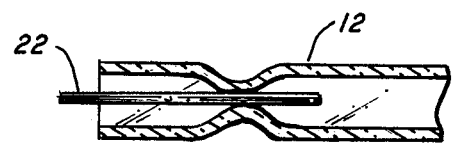
FIGS. 5, 6, 7 and 8 illustrate various embodiments for preparation of the end of the quartz envelope prior to fixing to the base.

FIG. 5 shows a quartz envelope made from high cost precision diameter tubing. The outside diameter of this tubing is consistly within acceptable tolerances. Thus, its end fits into the heated tubular extension 11b of all precision machined bases 11. Since the diameters of the tubular extension 11b and that of the end of quartz envelope 12 are both highly accurate, the shrink fit meets the necessary standards for a highly secure fit. In this case, the entire envelope is precision tubing and offers the advantage of one piece single step fabrication.

FIG. 5 shows the envelope 12 with a ring seal 21 for securing the electrode 22. Use of the ring seal at the end of the tubular extenion 11b offers the added advantage of reducing tensile stress on the envelope 12 during cooling and shrinkage of the tubular extension 11b.

Figure 6:
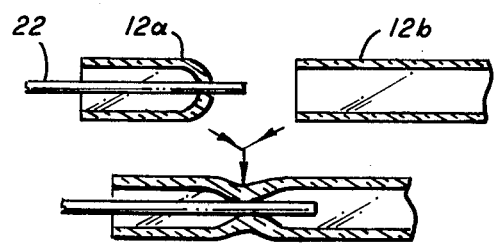

FIG. 6 shows another arrangement which is less costly than the arrangement of FIG. 5. In this arrangement only the end 12a of the envelope 12 which is secured to the base 11 is of high cost precision tubing while the rest of the envelope, e.g. 12b is made from less costly stock tubing. In this version, electrode 22 is fixed by fusing envelope end 12a as shown. The two parts are then fused together as shown.

Figure 8:
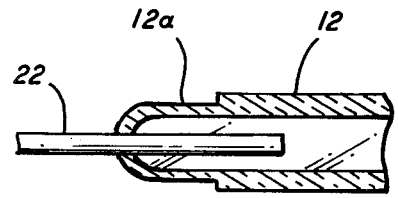

FIG. 8 illustrates a third version of envelope tubing suitable for use with the present invention. In this version, stock tubing is used but the end which is to be secured by tubular extension 11b is machined to the desired tolerance. Electrode 22 is fixed by fusing.

Figure 7:
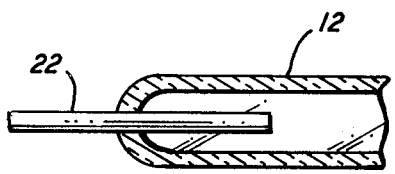

FIG. 7 illustrates still another version wherein stock tubing is used. In this version, the inconsistency in diameters of stock tubing is accommodated by having a variety of bases with tubular extenion of various inside diameters. The end of the envelope to be secured to the base is measured and a base is chosen which has an acceptable inside diameter.

Figure 3A:
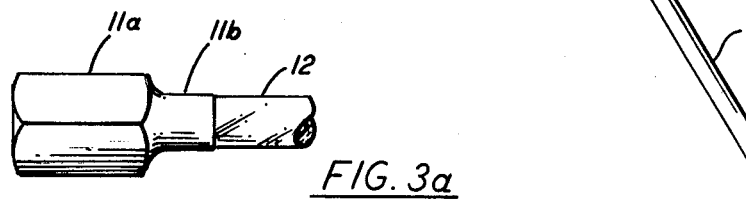
FIGS. 3a and 3b show the base mounted on quartz envelope in one way.
Figure 3B:
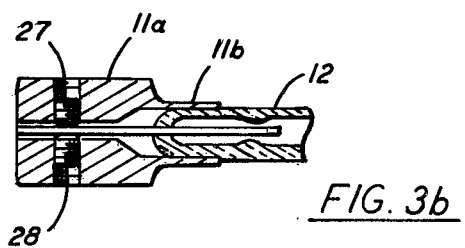

FIGS. 3a and 3b show a base secured to an envelope 12 wherein the tubular extension 11b faces in the direction of the envelope. This has the advantage of easy electrical contact, e.g., via screws 27 and 27 which form an electrical contact between the base 11 and electrode 22. While the version of FIGS. 3a and 3b can accommodate any of the tube ends 12a shown in FIGS. 5, 6, 7, and 8, the machined end version of FIG. 8 is shown. The version of base 11 shown in FIGS. 3a and 3b also has the advantage that the end 12a sees a thin walled compliant tube during insertion.

Figure 4A:
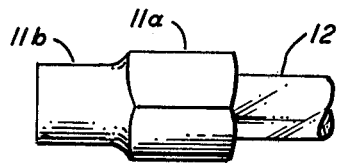
FIGS. 4a and 4b show a base mounted on a quartz envelope in the reverse direction.
Figure 4B:
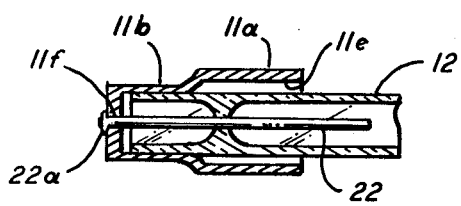

FIGS. 4a and 4b show the base 11 in the reverse orientation as that of FIGS. 3a and 3b. In this version, the portion 11a has a bore 11e of somewhat larger diameter than the diameter of the envelope 12. However, the same dimansional relationship exists between the tubular extension 11b and the end of the envelope.

In the version of FIGS. 4a and 4b, the envelope 12 is inserted through bore 11e into the heated tubular extension 11b which is then allowed to cool.

Electrical connection to the base 11 in this version may be made by solder, compression fit or other means to connect electrode end 22a to base 11 at opening 11f.

As in the version of FIGS. 3a and 3b, the base orientation of FIGS. 4a and 4b is compatable with all the envelope versions of FIGS. 5, 6, 7 and 8.

An advantage of the version of FIGS. 4a and 4b is that the particular orientation of the base permits the tubular extension 11b, which is sensitive to heat, to be further away from the glass envelope 12 during bake out, i.e., a heat treatment for evicting unwanted gases, etc. from the cavity 14.

Figure 9:
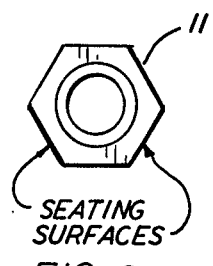
FIG. 9 illustrates a hexagonal configuration to the base.

FIG. 9 illustrates the hexagonal shape of portion 11a which permits mounting of the lamp 10 in a particular operating environment as described in the above mentioned U.S. Pat. No. 3,878,419.

Figure 10:
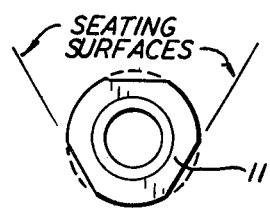
FIG. 10 illustrates another configuration of the mounting base.

FIG. 10 illustrates a base configuration having only the three mounting flats necessary to mount the lamp 10 in the operating environment.

The base of FIG. 9 is machined first and then fixed to the envelope 12. The base of FIG. 10 is first fixed to the envelope 12 as a round base and then machined to generate the two necessary seating surfaces and one clamping surface. The machining is done using a fixture in order to accurately position the seating surfaces with respect to the electrode which may have been positioned slightly off center. This consideration is critical only where a lamp 10 similar to that of FIG. 1 needs to be accurately positioned in a work environment called for by the above mentioned U.S. Pat. No. 4,011,011.

Both bases of FIGS. 3 and 4 have the shortcoming in that the position of the electrode with respect to the seating surfaces of the base is determined by geometrical tolerances during fabrication. Once the glass envelope is secured to the metal base, there exists only a limited degree for possible correction. The base of FIG. 10 corrects this shortcoming by making the correction by having the capability of generating the mounting surface relative to the orientation of the electrode.

As previously mentioned, any one of the base orientations of FIGS. 3 and 4 may be used with any one of the envelopes of FIGS. 5, 6, 7 and 8. In addition, the mounting surfaces may be generated on the base prior to or after securing the base 11 to the envelope 12 on all versions.

While the present invention has been described with reference to a specific type of lamp, it should be noted that the present invention has utility for any lamp where a metal base is to be fixed to a quartz lamp envelope.

Other modifications for the present invention are possible in light of the above description which should not be construed as limiting the present invention beyond those limitations set forth in the claims which follow:

What is claimed is:

1. A lamp comprising;
   a tubular quartz envelope,
   a metal base having a tubular extension normally having an inside diameter smaller than the diameter of said tubular quartz envelope,
   said tubular extension having a thermal coefficient of expansion to permit one end of said quartz envelope to be inserted therein when said tubular extension is at predetermined temperature and to secure said one end in a compression fit when said tubular extension cools from said predetermined temperature,
   said tubular extension extrudes to cold form to said one end of said quartz envelope when said tubular extension cools to normal ambient temperature from said predetermined temperature.

2. A lamp according to claim 1 wherein said base comprises;
   a substantially solid portion from which said tubular extension extends.

3. A lamp according to claim 2 wherein, said quartz envelope is made entirely of precision diameter tubing.

4. A lamp according to claim 2 wherein, only the end secured by said tubular extension is made of precision diameter tubing.

5. A lamp according to claim 2 wherein, said quartz envelope is made entirely of non-precision diameter tube with said end secured by said tubular extension being machined to the desired precision diameter.

6. A lamp according to claim 2 or 1 wherein, the inside diameter of said tubular extension in the normal unheated state is 0.003±0.001 inches less than the diameter of said end.

7. A lamp according to claim 6 wherein said metal base is made of brass.

8. A lamp according to claim 7 wherein the wall thickness of said tubular extension is 0.006±0.002 inches.

9. A lamp according to claim 6 wherein said metal base is made of tungsten.

10. A lamp according to claim 6 wherein said metal base is made of aluminum.

11. A lamp according to claim 6 wherein said metal base is made of 303 stainless steel.

12. A lamp according to claim 6 wherein said metal base is made of 440 stainless steel.

13. A lamp according to claim 6 wherein said metal base is made of leadlow steel.

* * * * *